United States Patent
Sudo et al.

(10) Patent No.: US 9,534,318 B2
(45) Date of Patent: Jan. 3, 2017

(54) VITREOUS SILICA CRUCIBLE AND METHOD OF MANUFACTURING THE SAME

(75) Inventors: Toshiaki Sudo, Akita (JP); Taira Sato, Akita (JP); Shuichi Ikehata, Akita (JP); Manabu Shonai, Akita (JP); Takuji Nishi, Akita (JP); Takaya Satou, Akita (JP); Shinsuke Yamazaki, Akita (JP)

(73) Assignee: SUMCO CORPORATION, Tokyo (JP)

( * ) Notice: Subject to any disclaimer, the term of this patent is extended or adjusted under 35 U.S.C. 154(b) by 946 days.

(21) Appl. No.: 13/335,885
(22) Filed: Dec. 22, 2011

(65) Prior Publication Data

US 2012/0167821 A1 Jul. 5, 2012

(30) Foreign Application Priority Data

Dec. 29, 2010 (JP) .................... 2010-294593

(51) Int. Cl.
  C30B 19/02 (2006.01)
  C30B 35/00 (2006.01)
  C30B 15/00 (2006.01)

(52) U.S. Cl.
  CPC ............ *C30B 35/002* (2013.01); *C30B 15/00* (2013.01); *Y10T 117/10* (2015.01)

(58) Field of Classification Search
  CPC ....... G07C 1/24; H04N 1/0044; H04N 1/2112; H04N 1/2129; H04N 2121/00; H04N 2201/0077; H04N 5/77; Y10S 358/906; C30B 35/002; Y10T 117/10
  USPC ............ 117/13, 18, 35, 200, 206, 217, 220, 117/223, 932; 65/17.3, 17.4, 17.6, 28, 65/29.18, 29.19, 31, 33.1, 33.9, 42, 65/53–55, 60, 60.53, 66, 68, 124, 134.7, 65/144, 157, 302, DIG. 8; 428/34.1, 34.4, 428/34.6, 312.6, 335, 426; 219/121; 264/400

See application file for complete search history.

(56) References Cited

U.S. PATENT DOCUMENTS

| 5,298,717 A * | 3/1994 | DeRossett, Jr. ..... B23K 26/0643 219/121.68 |
| 6,641,663 B2 * | 11/2003 | Kemmochi ........... C03B 19/095 117/200 |
| 7,695,787 B2 * | 4/2010 | Tsuji et al. .................... 428/34.4 |

(Continued)

FOREIGN PATENT DOCUMENTS

| CN | 101479629 A | 7/2009 |
| JP | 06-239632 A | 8/1994 |

(Continued)

OTHER PUBLICATIONS

Inglis, Trans. Institute of Naval Architecture Jan. 1913; 55:219-241).*

(Continued)

*Primary Examiner* — Michael Kornakov
*Assistant Examiner* — Hua Qi
(74) *Attorney, Agent, or Firm* — Law Office of Katsuhiro Arai

(57) ABSTRACT

The present invention provides a method of manufacturing a vitreous silica crucible including: a taking-out process of taking out the vitreous silica crucible from the mold, a honing process of removing the unfused silica powder layer on the outer surface of the vitreous silica crucible, and further comprising, after the taking-out process and before the honing process, a marking process of marking an identifier comprised of one or more groove line on the outer surface of the vitreous silica crucible, wherein the groove line after the honing process has a depth of 0.2 to 0.5 mm, and a width of 0.8 mm or more at the opening of the groove line.

7 Claims, 8 Drawing Sheets

(56) References Cited

U.S. PATENT DOCUMENTS

| | | | |
|---|---|---|---|
| 7,905,112 B2* | 3/2011 | Fukui | C03B 19/095 65/17.3 |
| 2003/0044582 A1* | 3/2003 | Sakoske | B41M 1/12 428/195.1 |
| 2008/0047940 A1* | 2/2008 | Li | C03C 19/00 219/121.68 |
| 2009/0309733 A1 | 12/2009 | Moran et al. | |

FOREIGN PATENT DOCUMENTS

| | | | | |
|---|---|---|---|---|
| JP | 2533643 Y | 1/1997 | | |
| JP | 2533643 Y2 * | 1/1997 | | C30B 15/10 |
| JP | 2533643 Y2 * | 4/1997 | | |
| JP | 10-072276 A | 3/1998 | | |
| JP | 11-209136 A | 8/1999 | | |

OTHER PUBLICATIONS

Inglis, Trans. Institute of Naval Architecture Jan. 1913; 55:219-241.*
JP 2533643 Y2 original and translation.*
Extended European Search Report (EESR) mailed Mar. 22, 2012, issued by the European Patent Office for European counterpart Application No. EP 11195441.8.
Chinese Office Action issued by the State Intellectual Property Office of China, issued on Nov. 27, 2013, for Chinese counterpart application No. 201110445456.5.

* cited by examiner

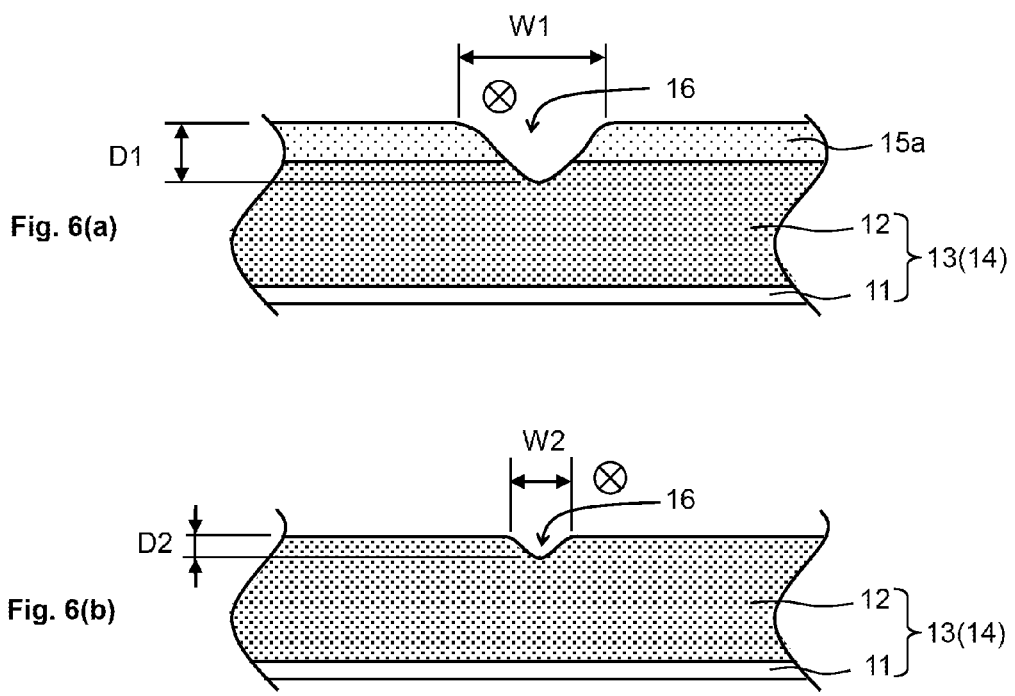

VITREOUS SILICA CRUCIBLE AND METHOD OF MANUFACTURING THE SAME

CROSS-REFERENCE TO RELATED APPLICATION

This application is related to Japanese Patent Application No. 2010-294593 filed on Dec. 29, 2010, whose priority is claimed and the disclosure of which is incorporated by reference in its entirety.

BACKGROUND OF THE INVENTION

1. Field of the Invention

The present invention relates to a vitreous silica crucible and a method of manufacturing the same.

2. Description of the Related Art

In general, silicon single crystal is manufactured by melting high-purity polycrystalline silicon in a vitreous silica crucible to obtain silicon melt, dipping an end of a seed crystal to the silicon melt, and pulling the seed crystal while rotating it.

In general, in a manufacturing process of a vitreous silica crucible, silica powder is deposited on an inner surface of a rotating mold, and arc fusing process is carried out to fuse the silica powder. Thereafter, a honing process is carried out to remove unfused silica powder attached on an outer surface of the crucible by spraying high-pressure water onto the outer surface of the crucible. Then, a rim cutting process is carried out to cut, in a certain width, an opening edge of the crucible so that the height after the rim cutting process is set to a predetermined value. Thereafter, washing process, drying process, inspection process, and HF (hydrofluoric acid) washing process are carried out before the vitreous silica crucible is shipped.

Related references are JP-U-2533643 and JP-A-H11-209136

SUMMARY OF THE INVENTION

Each user has a unique request, and thus various kinds of crucibles having different specifications are manufactured in the same manufacturing line. In particular, when the difference of the specifications is not discernable from the appearance, there is a problem that mix-up of the crucibles having different specifications can occur.

In order to prevent mix-up of crucibles, JP-U-2533643 discloses a method of grinding an identifying mark, indicating the grade of the crucible, on the outer surface of the crucible by use of a diamond air tool or the like. In this document, the grade of a crucible is identified by the number of recesses formed on the outer surface of the crucible. According to this method, a small number of crucibles can be distinguished. However, as the number of the kinds of crucibles increases, the number of recesses increases. Therefore, in view of manufacturing efficiency, it is not feasible to employ the technique of JP-U-2533643 in order to identify crucibles having various specifications.

Furthermore, JP-A-H11-209136 discloses a method of carrying out marking on a vitreous silica member by use of a YAG laser marker. The marking by use of a laser marker is relatively high speed, and it is possible to mark various symbols such as bar code, character, mark, sign, numeric character or the like. Therefore, the method of JP-A-H11-209136 is suitable for identification of various kinds of crucibles having different specifications.

According to the method of JP-A-H11-209136, the marking is formed by the processes of contacting a plate made of carbon or the like on a predetermined portion of a vitreous silica member, and irradiating the portion with a YAG laser through the vitreous silica member to print the carbon or the like on the vitreous silica member. However, when the method is applied to a crucible, the carbon or the like can be detached during pulling a silicon ingot, and can be mixed in silicon melt. Furthermore, in order to irradiate the portion with a YAG laser through the vitreous silica member, it is necessary to radiate the YAG laser from the inside to the outside of the crucible, and it is burdensome to move the laser marker into the inside of the crucible for each marking. Therefore, it is extremely difficult to utilize the technique of JP-A-H11-209136 for marking of a crucible.

Thus, any of the prior art is not useful for identification of various kinds of crucibles having different specifications, and thus the operators make a lot of effort to prevent mix-up of the crucibles in the manufacturing process.

The present invention has been made in view of these circumstances, and provides a method of manufacturing a vitreous silica crucible so that mix-up of crucibles in the manufacturing process can be prevented.

According to the present invention, provided is a method of manufacturing a vitreous silica crucible comprising: a silica powder layer forming process of forming a silica powder layer by depositing silica powder on an inner surface of a mold defining an outer shape of a vitreous silica crucible; an arc heating process of fusing, by arc heating, the silica powder layer in the mold to form a vitreous silica crucible having a vitreous silica layer and terminating the arc heating so as to leave unfused silica powder layer between the vitreous silica layer and the mold; a taking-out process of taking out the vitreous silica crucible from the mold; a honing process of removing the unfused silica powder layer on the outer surface of the vitreous silica crucible, and further comprising, after the taking-out process and before the honing process, a marking process of marking an identifier comprised of one or more groove line on the outer surface of the vitreous silica crucible, wherein the groove line after the honing process has a depth of 0.2 to 0.5 mm, and a width of 0.8 mm or more at the opening of the groove line.

The present inventors have made extensive research on how to prevent mix-up of crucibles in the manufacturing process, and come up with an idea of marking an identifier after the taking-out process and before the honing process.

Because unfused silica powder is attached to an outer surface of a vitreous silica crucible just after the taking-out process, and thus it is an general conception that it is inappropriate to carry out marking just after the taking-out process, and it is common sense to mark an identifier after removing the unfused silica powder in the honing process. However, the present inventors, despite of the common sense, have come up with an idea of marking the identifier in a state the unfused silica powder is attached to the outer surface of the vitreous silica crucible before the honing process.

When the marking is carried out after the honing process, a vitreous silica crucible is subjected to one or more process without an identifier between the arc heating process and the marking process, and thus mix-up of crucibles is likely to occur. However, as in the present invention, when the marking is carried out after the taking-out process and before the honing process, the marking is provided before the crucible is moved to a different place after the crucible is taken out of the mold. Therefore, mix-up of crucibles is unlikely to occur.

Furthermore, the present inventors have come up with an idea of marking an identifier comprised of one or more groove line. The "identifier" refers to a symbol which can be used for identification of the kind of a crucible, and is comprised of, for example, character, numeric character, or bar code. The present invention use an identifier comprised of one or more groove line, and thus can produce various kinds of identifiers, and thus can recognize various kinds of crucibles easily.

Furthermore, in the present invention, the line of the identifier has a depth of 0.2 to 0.5 mm after the honing process, and a width of 0.8 mm or more at the opening of the groove line. It is also an important point of the present invention to have the identifier with such depth and width. In the honing process, the unfused silica powder layer is removed and water gets into the groove line, and thus the visual recognition of the groove line becomes difficult. According to the investigation by the inventors, when the depth after the honing process is less than 0.2 mm or the width after the honing process is less than 0.8 mm, the visual recognition of the groove line is difficult and thus the visual recognition of the identifier is difficult. As the depth of the groove line increases, the visual recognition of the groove line becomes easier. However, when the groove line has a depth of more than 0.5 mm, cracks are more likely to be formed in the crucible.

Thus, according to the present invention, the mix-up of crucibles during manufacturing process can be prevented.

BRIEF DESCRIPTION OF THE DRAWINGS

FIGS. 6(a) and 6(b) are sectional views showing a configuration of a groove line according to one embodiment of the present invention, and FIG. 6(a) shows a state before the honing process, and FIG. 6(b) shows a state after the honing process.

FIG. 7(a) shows a state before the honing process, and FIG. 7(b) shows a state after the honing process.

DESCRIPTION OF THE PREFERRED EMBODIMENTS

Figure 1:
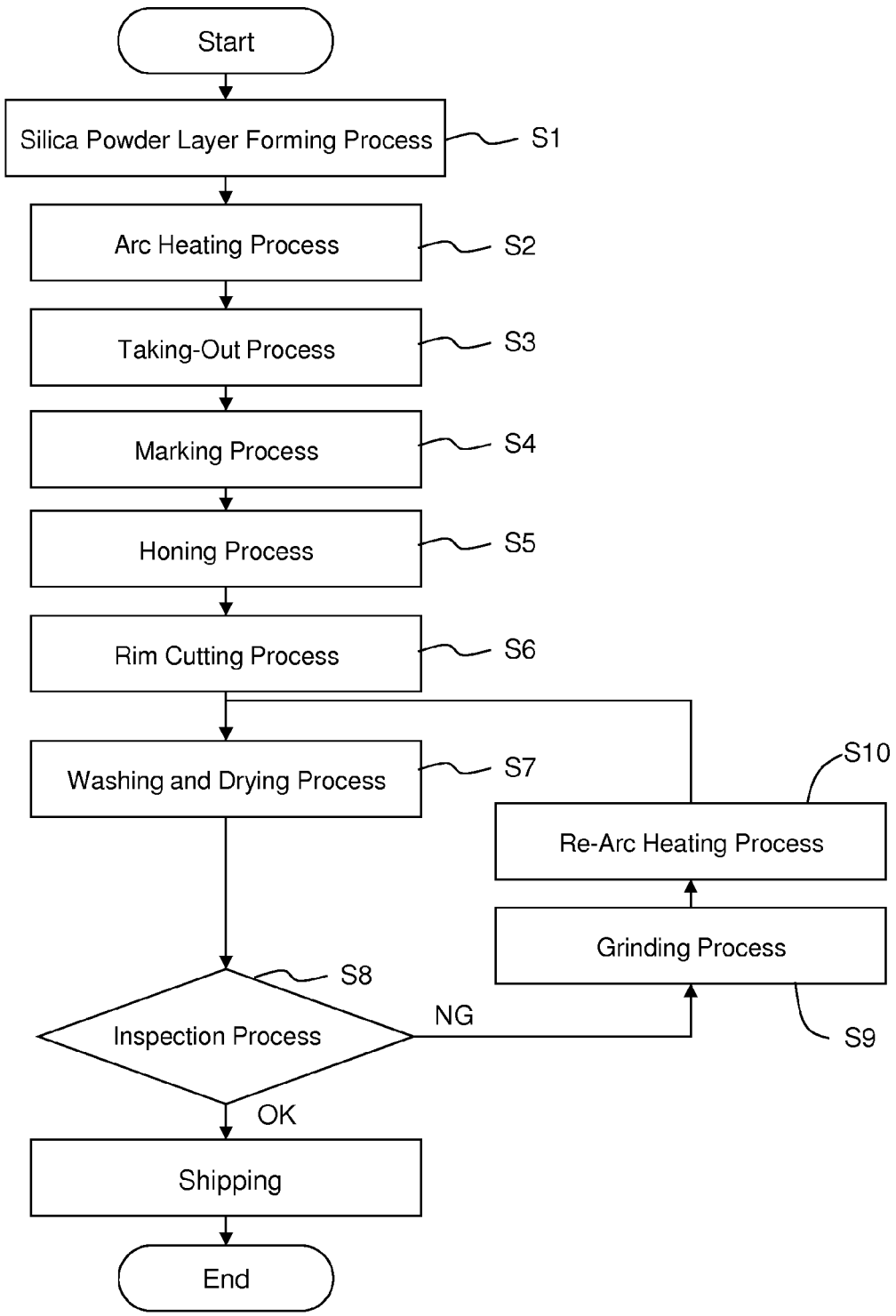
FIG. 1 is a flowchart showing a manufacturing process of a vitreous silica crucible according to one embodiment of the present invention.

Hereinafter, with reference to FIG. 1 to FIG. 9, one embodiment of the present invention will be explained.

The method of a vitreous silica crucible of the present embodiment includes a silica powder layer forming process of forming a silica powder layer 3 by depositing silica powder on an inner surface of a mold 1 defining an outer shape of a vitreous silica crucible 14, an arc heating process of fusing, by arc heating, the silica powder layer 3 in the mold 1 to form a vitreous silica crucible 14 having a vitreous silica layer 13 and terminating the arc heating so as to leave unfused silica powder layer 15 between the vitreous silica layer 13 and the mold 1, a taking-out process of taking out the vitreous silica crucible 14 from the mold 1, a honing process of removing the unfused silica powder layer 15a on the outer surface of the vitreous silica crucible 14, and further comprising, after the taking-out process and before the honing process, a marking process of marking an identifier comprised of one or more groove line 16 on the outer surface of the vitreous silica crucible 14, wherein the groove line 16 has a depth D2 of 0.2 to 0.5 mm after the honing process, and a width W2 of 0.8 mm or more at the opening of the groove line.

Furthermore, the method optionally further includes, after the honing process, a rim-cut process of removing, in a certain width, an opening edge of the vitreous silica crucible 14, a washing and drying process of washing and drying the vitreous silica crucible 14, and an inspection process of inspecting the vitreous silica crucible 14. Furthermore, when a foreign substance is found in the inspection process, the method optionally further includes a grinding process of removing the foreign substance by grinding, and re-arc heating process of arc heating the vitreous silica crucible 14 after the grinding.

Hereinafter, by use of a flowchart shown in FIG. 1, respective processes will be explained.

1. Silica Powder Layer Forming Process (Step S1)

Figure 2:
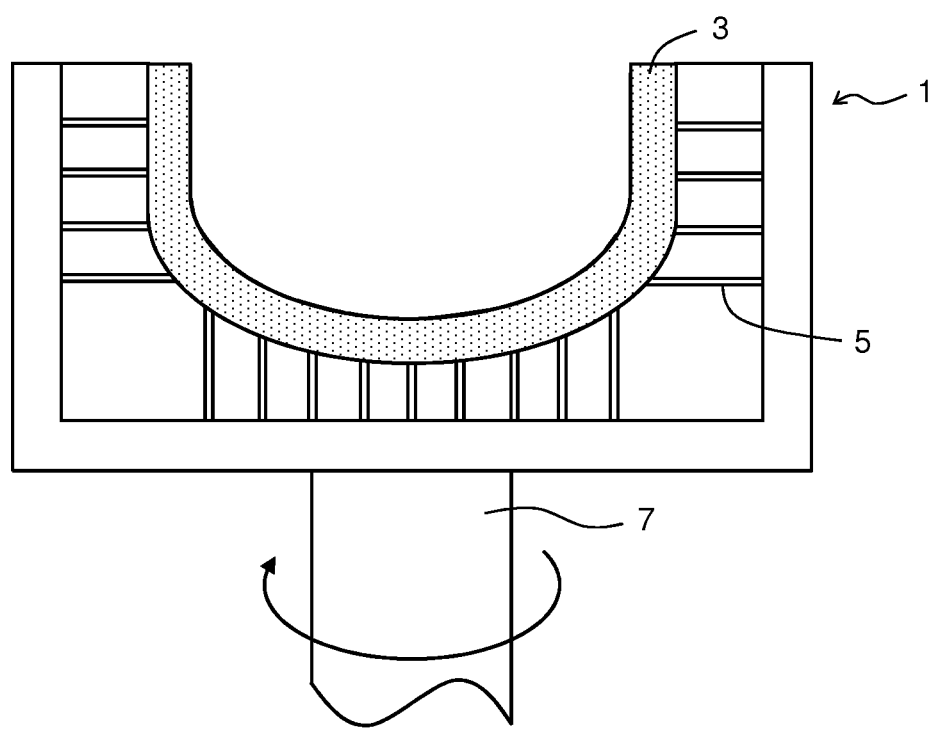
FIG. 2 is a sectional view for explaining a silica powder layer forming process according to one embodiment of the present invention.

In the silica powder layer forming process (Step S1), as shown in FIG. 2, silica powder is deposited on an inner surface of a mold 1 defining an outer shape of a vitreous silica crucible to form a silica powder layer 3. The mold 1 is rotatable around an axis 7, and silica powder is supplied to the mold 1 while rotating the mold 1. The mold 1 contains many ventilation holes 5, and the silica powder layer 3 is depressurized via the ventilation holes 5 during the fusing the silica powder layer 3 by arc heating.

The vitreous silica crucible has a shape of, for example, a corner portion having a relatively large curvature, and a cylindrical sidewall portion having an upward opening, and a bottom portion which is flat or has a relatively small curvature. In the present invention, the corner portion refers to a portion connecting the sidewall portion and the bottom portion, and starts at a point where a line tangential to the corner portion overlaps with the sidewall portion and ends at a point where the corner portion and the bottom portion have a common tangential line. In other words, the boundary between the sidewall portion and the corner portion is a point where a straight portion of a wall of the crucible starts to curve. Furthermore, the portion with a constant curvature at the bottom of the crucible is the bottom portion, and as the distance from the center of the crucible increases, a point where the curvature starts to change is the boundary between the bottom portion and the corner portion.

Silica powder may be either natural silica powder or synthetic silica powder. Natural silica powder can be manufactured by pulverizing natural mineral whose main component is α-quartz. Synthetic silica powder can be manufactured by chemical synthesis, such as gas phase oxidation (dry synthesis) of silicon tetrachloride ($SiCl_4$), or hydrolysis (sol-gel method) of silicon alkoxide ($Si(OR)_4$).

The silica powder layer 3 can be formed, in one example, by depositing natural silica powder and thereafter depositing synthetic silica powder. Natural vitreous silica made of natural silica powder has relatively large viscosity, and synthetic vitreous silica made of synthetic silica powder is highly-pure. Therefore, it is possible to form the silica powder layer 3 comprised of a natural silica powder layer on the outer side and a synthetic silica powder layer on the inner side, to manufacture a crucible having an inner surface with high purity and having a large strength.

The average particle diameter of silica powder is, for example, 200 to 600 µm. When the average diameter is too small, the silica powder readily hovers during forming a silica powder layer or arc fusing the silica powder layer. When the average diameter is too large, the surface of the silica powder layer is more likely to be rough.

By the way, "particle size" is, in general, as shown in the section of the term definition of "Test Powder and Test Particles" in JIS Z 8901, a size represented by the aperture size of a test sieve used for the measurement in the screening method, a size represented by the Stokes equivalent diameter obtained by the sedimentation method, a size represented by a circle equivalent diameter obtained in the microscope method, a size represented by a sphere equivalent diameter obtained by the light scattering method, or a size represented by a sphere equivalent diameter obtained by the electrical resistance test, and is also referred to as "particle diameter". However, in the present specification, the particle size distribution is measured by use of the laser diffraction/scattering measurement method using laser light as a light source.

The principle is to utilize a phenomenon that when particles are irradiated with light, the intensity and pattern of the light scattered by each particle changes depending on the particle diameter (Mie scattering). When the particle diameter is large, the intensity of the scattered light in all direction is strong, and the intensity of the forward scattered light is in particular strong. As the particle diameter decreases, the overall scattered light intensity weakens, and the forward-scattered light is only weakly detected. Therefore, when the particle diameter is large, the forward-scattered light collected by a convex lens generates a diffraction pattern on the focal plane. The brightness and size of the diffracted light depends on the particle size (particle diameter). Therefore, by use of information from the scattered light, the particle diameter can be obtained easily.

In contrast, when the particle diameter decreases, the intensity of the forward-scattered light weakens, and thus it is difficult to detect the light by use of a detector mounted in front. However, as the scattering pattern of the side-way and back scattered light changes depending on the particle diameter, it is possible to determine the particle diameter by measuring these. The measurement result is compared with a spherical particle exhibiting a scattering pattern equivalent to the scattering pattern for the measured particle, and the result is outputted as a particle size distribution. Therefore, for example, when a measured particle exhibits a diffracted/scattered light pattern equivalent to a sphere having a diameter of 1 µm, the diameter of the particle is determined to be 1 µm irrespective of the shape. The diameter is different from that determined by other measurement methods using visual or image analysis, such as "Feret diameter" corresponding to the length in a specific axis direction of randomly oriented particles, "equivalent diameter" corresponding to the size of a particle of an ideal shape (usually a circle) which has the same area as the projected area of the particle, or an aspect ratio representing the ratio of the long axis and short axis. Furthermore, the "average particle diameter" represents a particle diameter at an integrated value of 50% in the obtained particle size distribution.

2. Arc Heating Process (Step S2)

Figure 3:
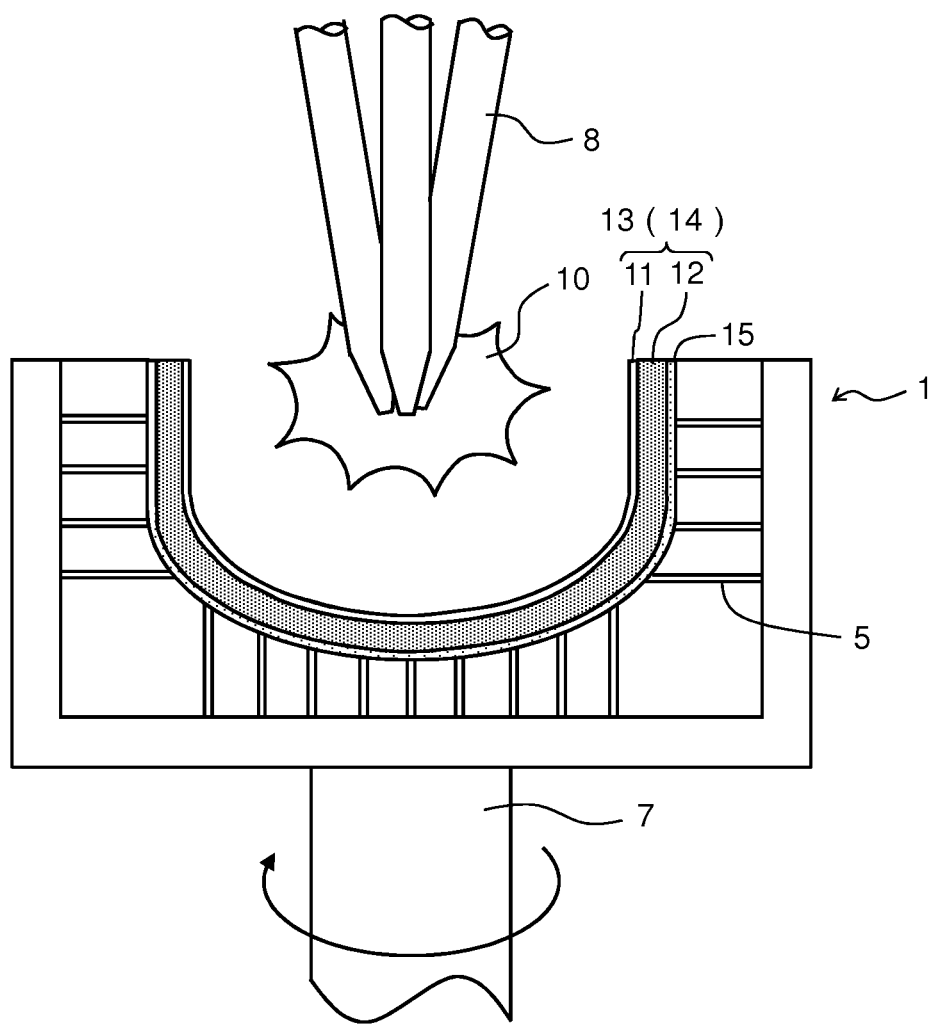
FIG. 3 is a sectional view for explaining an arc heating process according to one embodiment of the present invention.

Next, in the arc heating process (Step S2), as shown in FIG. 3, the silica powder layer 3 is fused (arc fused) within the mold 1 to form a vitreous silica layer 13, to obtain a vitreous silica crucible 14 and the arc heating is terminated so as to leave unfused silica powder layer 15 between the vitreous silica layer 13 and the mold 1. The arc fusing is carried out by generating arc discharge 10 between the electrodes (usually carbon electrodes) while rotating the mold 1 around the axis 7. The arc fusing is preferred to be carried out so as to achieve a temperature of 2000 to 2600 deg. C. in the inner surface of the silica powder layer 3 or vitreous silica layer 13. When the temperature of the arc fusing is too low, the silica powder layer 3 is not readily vitrified. When the temperature is too high, energy waste is large.

A transparent vitreous silica layer (hereinafter, referred to as "transparent layer") 11 having virtually no bubbles (i.e. bubble content of less than 0.5%) can be formed by depressurizing, from the mold 1 side via ventilation holes 5, the silica powder layer to a pressure of −50 kPa or more and less than −95 kPa while fusing the silica powder layer. Furthermore, after the transparent layer is formed, a bubble-containing vitreous silica layer (hereinafter, referred to as "bubble-containing layer") 12 having a bubble content of 0.5% or more and less than 50% can be formed on the outer side of the transparent layer by depressurizing the silica powder layer to a pressure of +10 kPa or more and less than −20 kPa. In the present specification, the bubble content rate refers to the ratio ($w_2/w_1$) of the volume ($w_2$) occupied by bubbles in a unit volume ($w_1$) of the crucible. In the present specification, the value of the pressure is the value with reference to the ambient air pressure.

The silica powder layer 3 is vitrified, by arc fusing, sequentially from the inner surface side. Therefore, even when the inner side of silica powder layer 3 is fused to be vitrified, a portion of the silica powder layer 3 contacting the mold 1 is still an unfused silica powder layer 15. When the total thickness of the silica powder layer 3 is vitrified, it becomes very difficult to take out a crucible from the mold 1, and thus the arc heating process is terminated in a state that unfused silica powder layer still remains on the outer surface side.

3. Taking-Out Process (Step S3)

Figure 4:
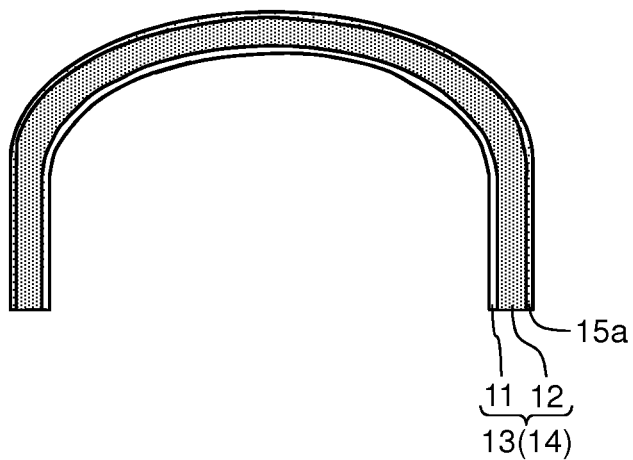
FIG. 4 is a sectional view for explaining a taking-out process according to one embodiment of the present invention.

Next, in taking-out process (Step S3), as shown in FIG. 4, vitreous silica crucible 14 is taken out from the mold 1. The vitreous silica crucible 14 can be, for example, taken out by turning the mold 1 upside down. Unfused silica powder is attached to the surface of the vitreous silica crucible 14 right after the crucible is taken out, to form an unfused silica powder layer 15a. A large portion of the unfused silica powder layer 15 remaining in the mold 1 after the arc heating process is not attached to the vitreous silica crucible 14, and thus the thickness of the unfused silica powder layer 15a of the outer surface of the vitreous silica crucible 14 is much smaller than that of the unfused silica powder layer 15 remaining in the mold 1 after the arc heating process. The thickness of the unfused silica powder layer 15a can vary depending on various conditions, and can be approx. 0.5 mm.

4. Marking Process (Step S4)

Figure 5:
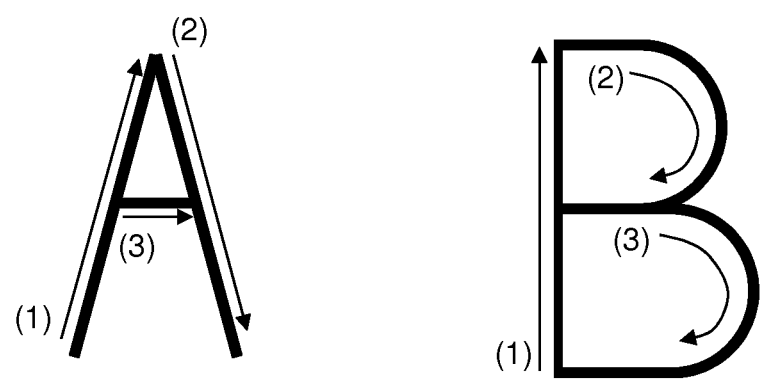
FIG. 5 is a view showing a configuration of an identifier according to one embodiment of the present invention.

Next, in the marking process (Step S4), an identifier comprised of one or more groove line is marked on the outer surface of the vitreous silica crucible. The "identifier" refers to a symbol which can be used for identification of the kind of a crucible, and is comprised of, for example, character, numeric character, or bar code. Examples of the identifier are alphabetic characters such as A and B as shown in FIG. 5. Plural characters can constitute one identifier, or one character can constitute one identifier. The groove line may be linear or curved. In the case of "A", the identifier is comprised of three linear groove lines represented by (1) to (3). In the case of "B", the identifier is, for example, comprised of one linear groove line (1) and two curved groove lines (2) and (3). When the identifier is comprised of one or more groove line, various kinds of identifiers can be formed, and thus it is possible to identify various kinds of crucibles.

FIG. 6(a) is a sectional view which is vertical to the longitudinal direction of the groove line, and shows, from the inner side, a vitreous silica layer 13 and an unfused silica powder layer 15a. The vitreous silica layer 13 is comprised of, from the inner side, a transparent layer 11 and a bubble-containing layer 12. The groove line 16 is formed so as to penetrate the unfused silica powder layer 15a and reach the vitreous silica layer 13.

In the honing process, which will be explained later, as shown in FIG. 6(b), the unfused silica powder layer 15a is removed, and thus only the groove line 16 formed in the vitreous silica layer 13 is left. The groove line 16 needs to be visually recognizable in a state after the unfused silica powder layer 15a is removed, and thus the groove line 16 needs to be formed in the marking process so that the groove line after the honing process has a depth D2 of 0.2 to 0.5 mm and a width W2 of 0.8 mm or more at the opening of the groove line 16. Therefore, for example, when the thickness of the unfused silica powder layer 15 is 0.5 mm, the groove line 16 needs to be formed so that the groove line 16 before the honing process has a depth D1 of 0.7 to 1.0 mm. The groove line 16 before the honing process has a width W1 of, for example, 1.2 to 1.4 mm at the opening of the groove line 16 although the width can vary depending on the shape of the groove line 16.

It is an important aspect of the present embodiment to have an identifier comprised of a line with such depth and width. In the honing process, the unfused silica powder layer 15a is removed and water gets into the groove line 16, and thus the visual recognition of the groove line 16 becomes difficult. According to the investigation by the present inventors, it has been found that when the depth after the honing process is less than 0.2 mm or the width after the honing process is less than 0.8 mm, the visual recognition of the groove line 16 is difficult, and thus the visual recognition of the identifier becomes difficult. As the depth of the groove line 16 increases, the visual recognition of the groove line 16 becomes easier. However, when the depth of the groove line 16 is larger than 0.5 mm, cracks are likely to be formed in the crucible. Furthermore, the groove line 16 after the honing process is preferred to have a width W2 of 2 mm or more. When the width is over 2 mm, the line width is too large, and thus the adjacent lines are likely to be overlapped, and thus the visual recognition can become more difficult.

The shape of the groove line 16 in a sectional view may be, as shown in FIGS. 6(a) and 6(b), substantially V-shaped. However, according to the experiments carried out by the inventors, when the shape of the groove line 16 is V-shaped, there is a problem that the crucible is easy to be cracked in the arc heating process to be described later.

So, the inventors have made further research to solve the problem and found that it is possible to solve the problem that cracks are likely to be formed in the crucible during a re-arc heating process by employing, for the cross-sectional shape of the groove line 16, an inverse trapezoid shape which is a shape obtained by turning trapezoid upside down. Furthermore, when the groove line 16 is formed in such a shape, it is possible to prevent cracks of the crucible during pulling a silicon single crystal.

The groove line 16 is preferred to be formed so that the width B2 at the bottom of the groove line 16 is 30 to 95% of the width W2 at the opening of the groove line 16. B2/W2 is specifically, for example, 30, 40, 50, 60, 70, 80, 90, 95%, and it can be in the range between any two of the values exemplified here.

When the position of marking an identifier is not in particular limited, but it is preferred that the marking is provided in a position remote from silicon melt so as not to adversely affect the pulling of a silicon single crystal. For example, the identifier is preferred to be provided on a position within 30 mm from the opening edge of the vitreous silica crucible 14. Furthermore, when the rim cutting process is carried out, the identifier is preferred to be marked on a position within 30 mm toward the bottom direction from the opening edge, after the rim cutting process, of the vitreous silica crucible 14.

Figure 8:
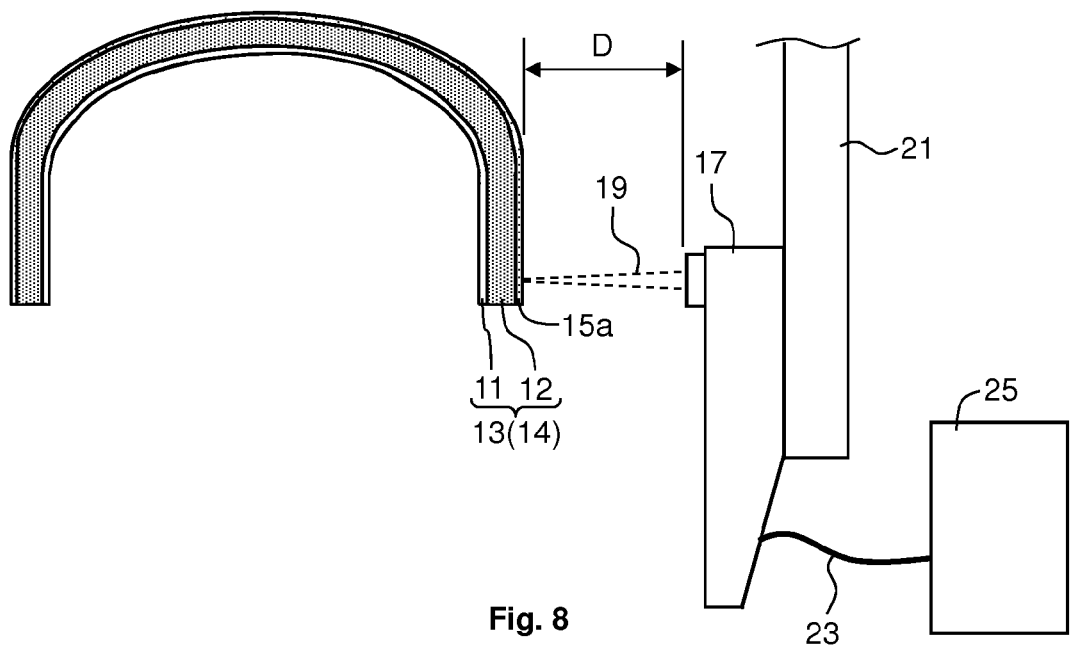
FIG. 8 is a view showing a method of marking an identifier by use of a laser marker according to one embodiment of the present invention.

The method of marking the identifier is not in particular limited, but, for example, as shown in FIG. 8, the marking is carried out by setting, on the outer surface of the vitreous silica crucible 14, the focal point of the laser 19 released from the laser marker 17, and, in that state, scanning the focal point along the longitudinal direction of the groove line 16. The longitudinal direction of the groove line 16 is a direction shown by a symbol (x) (indicating a direction perpendicular to the plane of the sheet) in FIG. 6. The kind of the laser is not in particular limited as long as the laser is the one having a wavelength which can be absorbed by vitreous silica, and the example is a carbon dioxide laser. The carbon dioxide laser is a laser generated by stimulated emission from carbon dioxide gas excited to be in an inverted population state. In general, the carbon dioxide laser has a wavelength of 9.3 to 10.6 μm, and is easily absorbed by vitreous silica, and thus is appropriately used for the marking on the surface of the vitreous silica crucible.

The laser marker 17 is, for example, attached to a strut 21, and controlled by a controller 25 via a cable 23. The controller 25 can control the three-dimensional position of the laser 19, and thus allow the laser 19 to be scanned, while keeping a constant spot size, along the outer surface of a target having a curved outline such as the outer surface of the vitreous silica crucible 14. The controller 25 can control various conditions of the laser 19, such as the output, scanning position, scanning speed and the like. The distance D between the laser marker 17 and the vitreous silica crucible 14 can be appropriately set depending on the working distance of the laser marker 17.

Figure 7A:
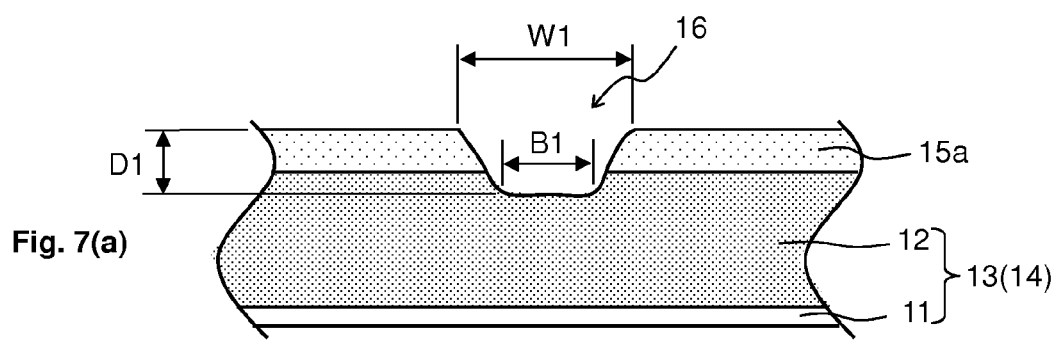
FIGS. 7(a) and 7(b) are sectional views showing another configuration of a groove line according to one embodiment of the present invention.
Figure 9A:
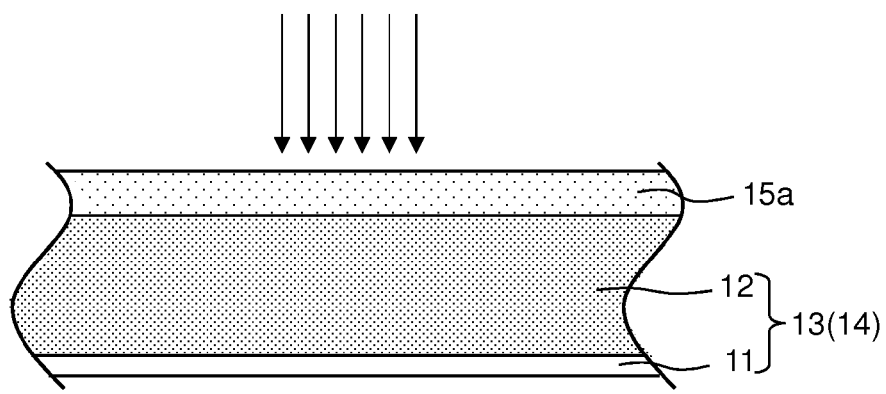
FIGS. 9(a) and 9(b) are sectional views showing a method of carrying out laser scanning at plural positions in the width direction.
Figure 9B:
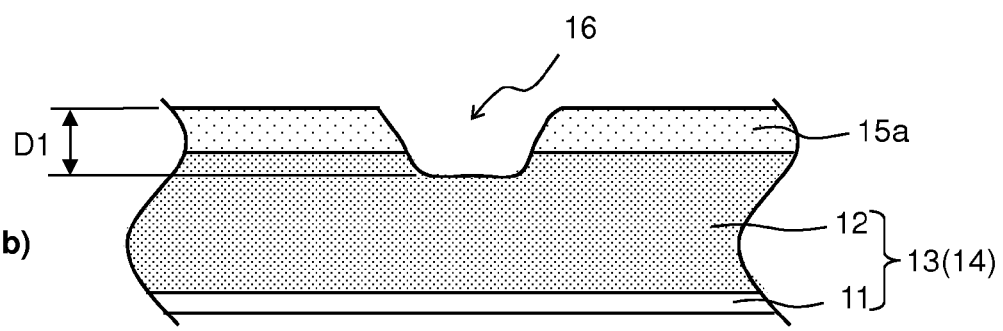

The intensity of the laser 19 is strongest in the center of the focal spot, and weakens as the distance from the center increases. Therefore, when the marking is carried out by scanning the focal spot of the laser 19 along the longitudinal direction of the groove line 16 without changing the position of the focal spot in the width direction position of the focal spot, a substantially V-shaped groove line 16 is formed as shown in FIG. 6(a). As explained above, such a substantially V-shaped groove line 16 can cause cracks of a crucible in the re-arc heating process, and thus is not preferred. Then, the inventors have investigated on how to form a groove line 16 having an inverse trapezoid shape as shown in FIG. 7(a) and found out that such groove line can be formed, as shown in FIG. 9(b) by scanning the laser 19 at plural width-direction positions as shown by the arrows in FIG. 9(a). Such scanning can be carried out by changing the focal position of the laser 19 in the width direction. The number of the width-direction positions is, for example, 3 to 10, and preferred to be 5 to 7. When the number is too small, the groove line having an inverse trapezoid shape is difficult to be formed. When the number is too large, the marking takes too much time.

The number of laser scans across each width-direction position (i.e., how many times a laser scans across each width-direction position in the width-wise direction) is not in particular limited, and is, for example, 1 to 10, and preferred to be 3 to 7, and more preferred to be 4 to 6. When the number of laser scans is too small for forming the groove line 16, the amount of heat applied to the crucible at a time-per scan is too much, and thermal strain is formed in the crucible, which leads to crack formation in the crucible. When the number of laser scans is too large for forming the groove line 16, the amount of heat applied to the crucible per scan is too small, and thus the groove line 16 is difficult to form.

The output of the laser 19 in the marking is not in particular limited, and can be adjusted considering the state of the marking. The output is, for example, 15 to 40 W. When the laser output is too small, the groove line 16 is not formed or it takes too much time to form the groove line 16. When the laser output is too large, cracks are more likely to be formed in the crucible by heat strain. The laser 19 can be either continuous output or pulsed output. When the laser is pulsed output, the groove line 16 is a dotted line, and strain is large between the dots, and thus continuous output is preferred. The speed of the laser scanning is, for example, 5 to 30 mm/s, and can be adjusted considering the balance with the laser output so as to carry out appropriate marking.

5. Honing Process (Step S5)

Figure 7B:
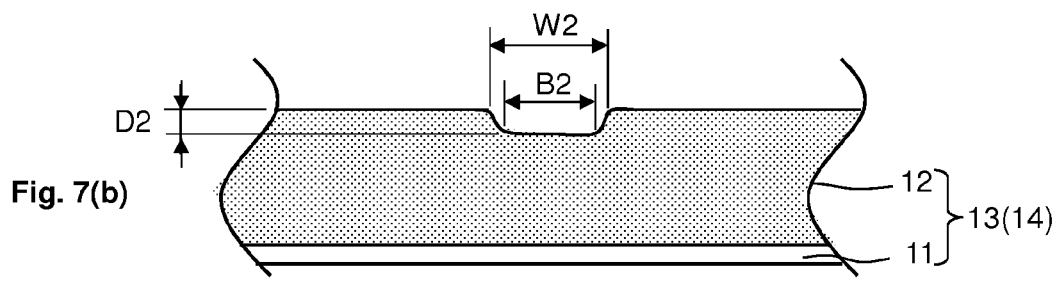

Next, in the honing process (Step S5), the unfused silica powder layer 15a on the outer surface of the vitreous silica crucible 14 is removed to leave the groove line 16 in a state shown in FIG. 6(b) and FIG. 7(b). In this state, only the portion formed in the vitreous silica layer 13 is left. In the honing process, the unfused silica powder layer 15a is removed, for example, by spraying water (high-pressure water) to the outer surface of the vitreous silica crucible 14. In the honing process, the portion, of the groove line 16, formed in the unfused silica powder layer 15a is removed, and water gets into the groove line 16, and thus the visibility of the groove line 16 deteriorates.

Therefore, in the marking process, the groove line 16 needs to formed in a way that the groove line 16 is still visible even after the unfused silica powder layer 15a is removed in the honing process. Thus, the groove line 16 needs to be formed in a way that the depth after the honing process is 0.2 to 0.5 mm, and the width at the opening of the groove line after the honing process is 0.8 mm or more. The pressure of the sprayed water is not in particular limited as long as the pressure is sufficient to remove the unfused silica powder layer 15a, and, for example, 0.1 to 10 MPa, and more specifically 0.1, 0.2, 0.5, 1, 2, 4, 5, 10 MPa, and it can be in the range between two values of the values exemplified here.

6. Rim Cutting Process (Step S6)

Next, in the rim cutting process (Step S6), the opening edge of the vitreous silica crucible 14 is removed in a certain width. By this process, the crucible height is set to a desired value.

7. Washing and Drying Process (Step S7)

Next, in the washing and drying process (Step S7), the vitreous silica crucible is washed by use of water or the like, followed by drying.

8. Inspection Process (Step S8)

Next, in the inspection process (Step S8), the vitreous silica crucible 14 is inspected to see whether the dimensions of the vitreous silica crucible 14 comply with the specifications and there is a foreign substance in the vitreous silica crucible 14. The vitreous silica crucible 14 is packed and shipped after it has passed this inspection. Before the packing, HF washing and subsequent drying may be carried out.

9. Grinding Process (Step S9)

When the vitreous silica crucible 14 has failed to pass the inspection because of the foreign substance in the vitreous silica crucible 14, a grinding process is carried out to remove the foreign substance by grinding (Step S9). The foreign substance is removed by this process, but a scratch is formed in the inner surface of the crucible by the grinding, and the scratch can adversely affect pulling of a silicon single crystal, and thus the scratch is removed by a re-arc heating process.

10. Re-Arc Heating Process (Step S10)

In the re-arc heating process (Step S10), the crucible after the grinding process is subjected to short-time arc heating to fuse the crucible surface and thus to remove scratch formed in the grinding process. When the groove line 16 is substantially V-shaped as shown in FIG. 6(b), the crucible is easily broken up in the re-arc heating process. However, when the groove line 16 is in an inverse trapezoid shape, the crucible is difficult to be broken up in the re-arc heating process. Thus, the inverse trapezoid shape is preferred.

Thus, according to the present embodiment, marking of the identifier is carried out after the taking-out process and before the honing process, and thus mix-up of crucibles in the manufacturing process can be prevented. In addition, a customer using crucibles having different kinds of specifications desires to recognize the kinds of the crucibles easily. According to the present embodiment, the depth of the groove line is 0.2 to 0.5 mm, and the width at the opening of the groove line is 0.8 mm or more, and thus the identifier is easily visible, and the kinds of crucibles can be recognized easily.

Example

Silica powder was deposited, in a thickness of 15 mm, on an inner surface of a mold having an opening diameter of 610 mm, to form a silica powder layer. Then the silica powder layer was fused by arc heating while depressurizing the silica powder layer from the mold side, to form a vitreous silica crucible having, from the inner side, a transparent layer and a bubble-containing layer. Next, the vitreous silica crucible was taken out of the mold. Then, the identifier "ABC" was marked on the crucible having unfused silica powder attached thereto in the conditions shown in Table 1 by use of a carbon dioxide laser having a maximum output of 30 W. The value in % of the laser output is with respect to the maximum output.

Then, the unfused silica powder layer was removed by spraying high-pressure water to the outer surface of the vitreous silica crucible in the honing process. After this process, the identifier was observed to see if the identifier was visibly recognizable. The criteria in the "Visibility" column are as follows. When the identifier was clearly recognizable, the crucible was evaluated as "A". When the identifier was recognizable, but not very clear, the crucible was evaluated as "B". When the identifier was not easily recognizable, the crucible was evaluated as "C".

Then, the crucible after the honing process was subjected to the re-arc heating process. The criteria in the "Resistance to Crack" column are as follows. When the crucible was broken up, the crucible was evaluated as "C". When a small crack was formed around the marking of the identifier, the crucible was evaluated as "B". When no crack was formed around the marking of the identifier, the crucible was evaluated as "A".

The results are shown in Table.

TABLE 1

| | Laser Output | Scanning Speed (mm/s) | Number of Width-Direction Positions | Number of Scanning at Each Width-Direction Position | Groove Line after Honing Process Width (mm) | Depth (mm) | Shape (Bottom Width/Opening Width) | Visibility | Resistance to Crack |
|---|---|---|---|---|---|---|---|---|---|
| Ex. 1 | 95% | 20 | 6 | 5 | 1 | 0.3 | Inverse Trapezoid (80%) | A | A |
| Ex. 2 | 80% | 20 | 5 | 5 | 0.8 | 0.2 | Inverse Trapezoid (80%) | B | A |
| Ex. 3 | 95% | 15 | 5 | 6 | 1 | 0.5 | Inverse Trapezoid (60%) | A | A |
| Ex. 4 | 60% | 5 | 1 | 5 | 1 | 0.3 | Substantially V-shaped | A | B |
| Comp. Ex. 1 | 95% | 10 | 5 | 6 | 1.2 | 0.7 | Inverse Trapezoid (50%) | A | B |
| Comp. Ex. 2 | 80% | 5 | 1 | 5 | 1.8 | 0.7 | Substantially V-shaped | A | C |
| Comp. Ex. 3 | 70% | 20 | 6 | 5 | 0.8 | 0.15 | Inverse Trapezoid (85%) | C | A |
| Comp. Ex. 4 | 80% | 20 | 4 | 5 | 0.65 | 0.2 | Inverse Trapezoid (80%) | C | A |

Table 1 shows that Examples 1 to 4 where the depth and the width of the groove line after the honing process is 0.2 to 0.5 mm and 0.8 mm or more, respectively, were good at the Visibility, and good at the Resistance to Crack in the re-arc heating process. However, when the depth was 0.2 mm, the visibility was slightly worse, and thus it was found that the depth was preferred to be 0.3 mm or more. Furthermore, when the shape of the groove line was substantially V-shaped, the evaluation in the Resistance to Crack was slightly low, and thus it was found that the shape of the groove line is preferred to be inverse trapezoid.

Furthermore, as in Comparative Example 1 even when the shape of the groove line was inverse trapezoid, the evaluation in the Resistance to Crack was low when the groove line was too deep. Furthermore, as in Comparative Example 2, when the shape of the groove line is V-shape, the evaluation in the Resistance to Crack was lower.

Furthermore, when the depth of the groove line was less than 0.2 mm as in Comparative Example 3, or when the width of the groove line was less than 0.8 mm as in Comparative Example 4, the visibility of the identifier was very bad.

EXPLANATION OF REFERENCE SYMBOL

1: Mold,
3: Silica Powder Layer,
5: Ventilation Hole,
7: Axis,
8: Electrode,
10: Arc Discharge,
11: Transparent Vitreous Silica Layer,
12: Bubble-Containing Vitreous Silica Layer,
13: Vitreous Silica Layer,
14: Vitreous Silica Crucible,
15: Unfused Silica Powder Layer,
15a: Unfused Silica Powder Layer,
16: Groove Line,
17: LaserMarker,
19: Laser,
21: Strut,
23: Cable,
25: Controller

What is claimed is:
1. A method of manufacturing a vitreous silica crucible for pulling a silicon single crystal, comprising:
a silica powder layer forming process of forming the silica powder layer by depositing silica powder on an inner surface of a mold defining an outer shape of the vitreous silica crucible;
an arc heating process of fusing, by arc heating, the silica powder layer in the mold to form the vitreous silica crucible having a vitreous silica layer and terminating the arc heating so as to leave unfused silica powder layer between the vitreous silica layer and the mold;
a taking-out process of taking out the vitreous silica crucible from the mold;
a honing process of removing the unfused silica powder layer on the outer surface of the vitreous silica crucible; and
further comprising, after the taking-out process and before the honing process, a marking process of marking by a laser beam an identifier comprised of multiple groove lines constituting alphabetic characters, numeric characters, or a bar code on the outer surface of the vitreous silica crucible to identify various kinds of crucibles, wherein each groove line after the honing process has a depth of 0.2 to 0.5 mm, and a width of 0.8 mm or more at the opening of the groove line, and each groove line has a cross-sectional shape of an inverse trapezoid;

each groove line is formed by:
(i) setting, on the outer surface of the vitreous silica crucible under the unfused silica powder layer, a focal point of the laser released from a laser marker;
(ii) in that state, reciprocally moving the focal point along a longitudinal direction of the groove line at a width-direction position to form a part of the groove line;
(iii) shifting the focal point in a width direction to a next width-direction position and repeating step (ii); and
(iv) repeating step (iii) to form each of the multiple groove lines with the inverse trapezoid cross section, wherein a width of an opening in the unfused silica powder layer is wider than a width of an opening in the each of the multiple groove lines, and the number of the width-direction positions is 3 to 10 for the each groove line.

2. The method of claim 1, wherein the width at the opening of the groove line was 2 mm or less.

3. The method of claim 1, wherein the laser is a carbon dioxide laser.

4. The method of claim 1, wherein the laser is scanned 3 to 7 times at each of the width-direction positions.

5. The method of claim 1, wherein the width of the groove line at the bottom is 30 to 95% of the width at the opening of the groove line.

6. The method of claim 1, further comprising:
an inspection process of inspecting the vitreous silica crucible after the honing process,
a grinding process of, when a foreign substance is detected in the inspection process, removing the foreign substance by grinding, and
a re-arc heating process of re-arc heating the vitreous silica crucible after the grinding.

7. The method of claim 1, further comprising a rim cutting process of removing an opening edge of the vitreous silica crucible in a certain width after the honing process, wherein
the identifier is marked on a position within 30 mm toward the bottom direction from the opening edge, after the rim cutting process, of the vitreous silica crucible.

* * * * *